US010673457B2

(12) United States Patent
Nelson et al.

(10) Patent No.: US 10,673,457 B2
(45) Date of Patent: Jun. 2, 2020

(54) SYSTEMS AND METHODS FOR DETECTING EVENTS THAT ARE SPARSE IN TIME

(71) Applicant: The Aerospace Corporation, El Segundo, CA (US)

(72) Inventors: Robert H. Nelson, San Gabriel, CA (US); George C. Valley, Los Angeles, CA (US); Susan H. Crain, Manhattan Beach, CA (US)

(73) Assignee: The Aerospace Corporation, El Segundo, CA (US)

( * ) Notice: Subject to any disclaimer, the term of this patent is extended or adjusted under 35 U.S.C. 154(b) by 278 days.

(21) Appl. No.: 15/090,533

(22) Filed: Apr. 4, 2016

(65) Prior Publication Data
US 2017/0285100 A1 Oct. 5, 2017

(51) Int. Cl.
*H03M 7/30* (2006.01)

(52) U.S. Cl.
CPC ................. *H03M 7/3062* (2013.01)

(58) Field of Classification Search
CPC ..... G01R 31/2882; G01R 31/02; H03M 7/30; H03K 5/00; H04S 3/004; H04S 7/306; H04S 7/304; H03H 15/02; H04L 5/06; H04L 27/2331
USPC ............. 327/91; 381/310; 333/165; 375/322
See application file for complete search history.

(56) References Cited

U.S. PATENT DOCUMENTS

| 3,651,316 | A | * | 3/1972 | Gibson | H04L 25/0305 327/100 |
| 3,740,591 | A | * | 6/1973 | Butler | H03H 15/02 333/165 |
| 4,851,840 | A | | 7/1989 | McAulay | |
| 6,236,862 | B1 | | 5/2001 | Erten et al. | |
| 6,326,910 | B1 | | 12/2001 | Hayduk et al. | |
| 6,346,124 | B1 | | 2/2002 | Geiser et al. | |
| 6,404,366 | B1 | | 6/2002 | Clark et al. | |
| 6,445,487 | B1 | | 9/2002 | Roddy et al. | |
| 6,724,334 | B2 | | 4/2004 | Tzelnick | |
| 6,801,147 | B2 | | 10/2004 | Thylen et al. | |
| 7,321,731 | B2 | | 1/2008 | Ionov et al. | |
| 7,536,431 | B2 | | 5/2009 | Goren et al. | |
| 7,834,795 | B1 | | 11/2010 | Dudgeon et al. | |

(Continued)

OTHER PUBLICATIONS

USPTO Notice of Allowance for U.S. Appl. No. 14/814,048, dated Mar. 31, 2016 (9 pages).

(Continued)

*Primary Examiner* — Mouloucoulaye Inoussa
(74) *Attorney, Agent, or Firm* — Jones Day

(57) ABSTRACT

Under one aspect, a method is provided for detecting events that are sparse in time. The method can include (a) receiving N analog input signals that are continuous and are independent from one another, wherein each one of the events causes a change in a corresponding one of the analog input signals, and N is 2 or greater. The method also can include (b) by a first analog circuit, for each of the N analog input signals, outputting products of that analog input signal and a plurality of gain factors. The method also can include (c) by a second analog circuit, outputting M sums of the products, wherein M is 2 or greater and is less than or equal to N. The method also can include (d) detecting a first one of the events based on the M sums of the products.

9 Claims, 10 Drawing Sheets

(56) References Cited

U.S. PATENT DOCUMENTS

| | | | |
|---|---|---|---|
| 8,026,837 B1* | 9/2011 | Valley | H04B 10/676 341/137 |
| 8,260,442 B2 | 9/2012 | Christensen et al. | |
| 8,902,096 B2 | 12/2014 | Valley et al. | |
| 2002/0114057 A1 | 8/2002 | Roddy et al. | |
| 2002/0126981 A1 | 9/2002 | Roddy et al. | |
| 2002/0154375 A1 | 10/2002 | Roddy et al. | |
| 2008/0015440 A1 | 1/2008 | Shandas et al. | |
| 2008/0062028 A1 | 3/2008 | Chang | |
| 2010/0201345 A1 | 8/2010 | Gupta et al. | |
| 2010/0241378 A1 | 9/2010 | Baraniuk et al. | |
| 2011/0234436 A1 | 9/2011 | Bogoni et al. | |
| 2012/0082319 A1* | 4/2012 | Jot | G10L 19/008 381/63 |
| 2014/0147013 A1 | 5/2014 | Shandas et al. | |
| 2014/0240163 A1 | 8/2014 | Boufounos | |
| 2014/0253350 A1* | 9/2014 | Imai | H03M 1/0617 341/118 |
| 2015/0036021 A1 | 2/2015 | Gigan et al. | |
| 2016/0072518 A1* | 3/2016 | Francis | H03M 1/468 341/122 |

OTHER PUBLICATIONS

Beck et al., "A fast iterative shrinking-thresholding algorithm for linear inverse problems," SIAM Journal on Imaging Sciences 2(1): 183-202 (2009).

Bortnik et al., "Predistortion technique for RF-photonic generation of high-power ultrawideband arbitrary waveforms," J. Lightwave Technology 24(7):2752-2759 (2006).

Bosworth et al., "High-speed ultrawideband compressed sensing of sparse radio frequency signals," CLEO: 2014, OSA Technical Digest (online) (Optical Society of America, 2014), paper SM1G.6 (4 pages).

Bosworth et al., "High-speed ultrawideband photonically enabled compressed sensing of sparse radio frequency signals," Opt. Lett. 38(22):4892-4895 (2013).

Candes et al., "Near Optimal Signal Recovery From Random Projections: Universal Encoding Strategies?" IEEE Trans. on Information Theory 52(12):5406-5425 (2006) Submitted Oct. 2004, Revised Mar. 2006.

Candes et al., "An Introduction to Compressive Sampling," IEEE Signal Processing Magazine 25(2):21-30 (2008).

Candes et al., "Near-optimal signal recovery from random projections: Universal encoding strategies?" IEEE Trans. on Information Theory 52(12): 39 pages (2006).

Chen et al., "Atomic decomposition by basis pursuit," SIAM Journal on Scientific Computing 20(1): 33-61 (1998).

Chi et al., "Microwave spectral analysis based on photonic compressive sampling with random demodulation," Opt. Lett. 37(22):4636-4638 (2012).

Chou et al., "Adaptive RF-Photonic Arbitrary Waveform Generator," IEEE Photonics Technology Letters 15(4): 581-583 (2003).

Chou et al., "Photonic bandwidth compression front end for digital oscilloscopes," J. Lightwave Technology 27 (22):5073-5077 (Nov. 15, 2009).

Donoho, David, "Compressed Sensing," IEEE Trans. on Information Theory 52(4):1289-1306 (2004) (Epub Sep. 14, 2014).

Gupta et al., "Power scaling in time stretch analog-to-digital converters," Proceedings of Avionics, Fiber-Optics and Phototonics and Photonics Technology Conference, AVFOP '09. IEEE, pp. 5-6 (Sep. 22-24, 2009).

Koh et al., "A Millimeter-Wave (40-45 GHz) 16-Element Phased-Array Transmitter in 0.18-μm SiGe BiCMOS Technology," IEEE Journal of Solid-State Circuits, 44(5):1498-1509 (2009).

Lee et al., "33MHz Repetition Rate Semiconductor Mode-Locked Laser Using eXtreme Chirped Pulse Oscillator," Conference on Lasers and Electro-Optics/Quantum Electronics and Laser Science Conference and Photonic Applications Systems Technologies, OSA Technical Digest (CD), 2 pages (Optical Society of America, 2008), paper CtuU7.

Lee et al., "Extreme Chirped Pulse Oscillator (XCPO) Using a Theta Cavity Design," IEEE Photonics Technology Letters 18(7):799-801 (2006).

Loris, Ignace, "L1 Packv2: A Mathematica package for minimizing an $\ell$ 1-penalized functional," pp. 1-17 (Aug. 20, 2008); [retrieved online on Aug. 20, 2008] from the Internet <URL: http://adsabs.harvard.edu/abs/2008CoPhC.179..895L>.

McKenna et al., "Wideband Photonic Compressive Sampling Analog-to-Digital Converter for RF Spectrum Estimation," in Proceedings of Optical Fiber Communication Conference, (Anaheim, Calif., 2013), paper OTh3D.1 (3 pages).

Min, "SiGe/CMOS Millimeter-Wave Integrated Circuits and Wafer-Scale Packaging for Phased Array Systems," A dissertation submitted in partial fulfillment of the requirements for the degree of Doctor of Philosophy in the University of Michigan (2008) (154 pages).

Mishali et al., "From Theory to Practice: Sub-Nyquist Sampling of Sparse Wideband Analog Signals," [retrieved online on Nov. 10, 2009] from the Internet <URL: http://arxiv.org/abs/0902.4291v3>, pp. 1-17.

Redding et al., "All-fiber spectrometer based on speckle pattern reconstruction," Opt. Express 21(5):6584-6600 (2013).

Sefler et al., "Holographic Multichannel Radio-Frequency Correlator," Optical Engineering 39(1):260-266 (2000).

Sefler et al., "Wide Bandwidth, High Resolution TimeStretch ADC Scalable to Continuous-Time Operation," Proceedings of Conference on Lasers and Electro-Optics, 2009 and 2009 Conference on Quantum electronics and Laser Science Conference, CLEO/QELS 2009, pp. 1-2 (Jun. 2-4, 2009).

Tropp et al., "Beyond Nyquist: Efficient Sampling of Sparse Bandlimited Signals," IEEE Transactions on Information Theory 56(1):520-544 (2010).

Tropp et al., "Signal recovery from random measurements via orthogonal matching pursuit," IEEE Trans. on Information Theory 53(12): 4655-4666 (2007).

Valley et al., "Optical multi-coset sampling of GHz-band chirped signals," Proc. SPIE vol. 9362 93620M-1 (Mar. 14, 2015); [retrieved online on Jul. 29, 2015], from the Internet <URL: http://proceedings.spiedigitallibrary.org/>, pp. 1-7.

Valley et al., "Optical time-domain mixer", in Optics and Photonics for Information Processing IV, Abdul Ahad Sami Awwal; Khan M. Iftekharuddin; Scott C. Burkhart, Editors, Proceedings of SPIE vol. 7797 (SPIE, Bellingham, WA 2010), 77970F.

Valley et al., "Sensing RF signals with the optical wideband converter", in Broadband Access Communication Technologies VII, Benjamin B. Dingel; Raj Jain; Katsutoshi Tsukamoto, Editors, Proceedings of SPIE vol. 8645 (SPIE, Bellingham, WA 2013), 86450P.

Valley et al., "Applications of the orthogonal matching pursuit/nonlinear least squares algorithm to compressive sensing recovery," Applications of Digital Signal Processing, ed. C. Cuadrado-Laborde, Intech, Croatia (2011):169-190.

Valley et al., "Compressive sensing of sparse radio frequency signals using optical mixing," Opt. Lett. 37 (22):4675-4677 (2012).

Valley, "Photonic Analog to Digital Converters," Optics Express 15(5):1955-1982 (2007).

Walden, "Analog-to-digital conversion in the early 21st century," Wiley Encyclopedia of Computer Science and Engineering, (edited by Benjamin Wah) Hoboken: John Wiley & Sons, Inc., pp. 1-14 (Sep. 9, 2008).

Wei et al., "New Code Families for Fiber-Bragg-Grating-Based-Spectral-Amplitude-Coding Optical CDMA Systems," IEEE Photonic Technology Letters 13(8):890-892 (2001).

Xiao et al., "Programmable Photonic Microwave Filters With Arbitrary Ultra-Wideband Phase Response," IEEE Trans. Microwave Theory and Technique 54(11):4002-4008 (2006).

Yin et al., "Multifrequency radio frequency sensing with photonics-assisted spectrum compression," Opt. Lett. 38(21):4386-4388 (2013).

USPTO Non-Final Office Action for U.S. Appl. No. 13/830,826, dated May 1, 2014 (7 pages).

(56) References Cited

OTHER PUBLICATIONS

USPTO Notice of Allowance for U.S. Appl. No. 12/765,721, dated May 31, 2011 (7 pages).
USPTO Notice of Allowance for U.S. Appl. No. 13/830,826, dated Aug. 21, 2014 (5 pages).

* cited by examiner

SYSTEMS AND METHODS FOR DETECTING EVENTS THAT ARE SPARSE IN TIME

FIELD

This application relates to detecting events.

BACKGROUND

A system can be considered to be sparse when, in some basis, the system can be completely represented by only a few components out of a large set of possible components. For example, a sine wave would not appear to be sparse when sampled in the time domain; however, in the frequency domain, the sine wave corresponds to a single frequency value within a large space of possible frequency values. As another example, a vector of length N with one non-zero component can be considered to be sparse. As yet another example, a continuously sampled vector in time of a superposition of several sinusoids can be considered to be sparse in the frequency domain. Different criteria have been developed so as to distinguish between sparse and not-sparse signals in various contexts, and different methods have been developed so as to attempt to recover information from a sparse system.

For example, compressive sensing techniques have been developed for multiplexing signals when the expected inputs are sparse in some basis. As is known in the art, compressive sensing attempts to solve a linear set of equations of the form:

$$y = A \cdot x + \delta y \quad (1)$$

where y is an M length measurement vector, x is an N length input vector to be recovered, M≤N, A is an M×N mixing matrix, and δy is the noise on the measurement. Let k represent the amount of information contained in N, then if k<M≤N, the signals can be reconstructed using known compressive sensing techniques. Compressive sensing techniques include, but are not limited to, $l_1$-norm minimization such as described in Chen et al., "Atomic decomposition by basis pursuit," SIAM Journal on Scientific Computing 20(1): 33-61 (1998), the entire contents of which are incorporated by reference herein; orthogonal matching pursuit such as described in Tropp et al., "Signal recovery from random measurements via orthogonal matching pursuit," IEEE Trans. On Information Theory 53(12): 4655-4666 (2007), the entire contents of which are incorporated by reference herein; or a fast-iterative shrinking thresholding algorithm such as described in Beck et al., "A fast iterative shrinking-thresholding algorithm for linear inverse problems," SIAM Journal on Imaging Sciences 2(1): 183-202 (2009), the entire contents of which are incorporated by reference herein. For further details regarding compressive sensing techniques, see Donoho, "Compressed sensing," IEEE Trans. On Information Theory 52(4): 1289-1306 (2004), the entire contents of which are incorporated by reference herein.

By using compressive sensing techniques, a relatively large system can be reduced down in dimension, allowing for monitoring the system using significantly fewer channels than the number of signals output by that system. However, not every possible mixing matrix A will work. For example, a mixing matrix desirably samples the entire input space, does not have any degenerate rows (rows with all of the same values, in the same positions, as one another), and does not have any row that is degenerate with possible sparse inputs (rows do not match expected sparse input vectors). In practice, such features can be met by constructing pseudo-random mixing matrices, such as matrices having random values of 1 and −1, random Gaussian values, or sets of orthogonal vectors.

One difficulty in reconstructing a system comes from the sparsity constraint that can be expressed as:

$$M \sim k \log \frac{N}{k} \quad (2)$$

where M, N, and k are as defined above. Equation (2) expresses the approximate number of measurements needed to recover a sparse vector of a given size, and guides the choice in matrix. For further details regarding such a sparsity constraint, see Candès et al., "Near-optimal signal recovery from random projections: Universal encoding strategies?" IEEE Trans. On Information Theory 52(12): 39 pages (2006), the entire contents of which are incorporated by reference herein.

SUMMARY

Embodiments of the present invention provide systems and methods for detecting events that are sparse in time. For example, some embodiments of the present systems and methods provide analog circuitry that can be used to mix down in dimension a relatively large number of signals, which signals may carry information about one or more events that occur, and which events can be detected based on the output of such mixing. Such analog circuitry can be used, for example, in large scale testing of electronic devices, such as resistors, capacitors, transistors, diodes, and the like, in which failures of such devices correspond to events and can be expected to occur sparsely in time. Previously known methods of testing such devices individually monitor respective signals from each device over a time in which the devices are expected to fail. In comparison, embodiments of the present circuits and methods can mix down in dimension the signals from the devices, meaning that only a relatively small number of measurements (e.g., on the order of the number of expected failures) can be used over the time in which the devices are expected to fail. Other events that are sparse in time similarly can be detected. Embodiments of the present devices and methods can mix, e.g., linearly mix, a relatively large set of analog signals including a sparse amount of information down in information for event detection using, for example, compressive-sensing recovery techniques.

Under one aspect, a method is provided for detecting events that are sparse in time. The method can include (a) receiving N analog input signals that are continuous and are independent from one another, wherein each one of the events causes a change in a corresponding one of the analog input signals, and wherein N is 2 or greater. The method also can include (b) by a first analog circuit, for each of the N analog input signals, outputting products of that analog input signal and a first plurality of gain factors. The method also can include (c) by a second analog circuit, outputting M sums of the products, wherein M is 2 or greater, and wherein M is less than or equal to N. The method also can include (d) detecting a first one of the events based on the M sums of the products.

In some embodiments, the N analog input signals include voltages, currents, frequencies, or phases from N corresponding electronic devices. In some embodiments, the first one of the events corresponds to a failure of a corresponding electronic device.

In some embodiments, the method includes, responsive to the failure of the electronic device, (e) by the first analog circuit, for each of the N analog input signals except for the analog input signal corresponding to the failed electronic device, outputting products of that analog input signal and a second plurality of gain factors, wherein the second plurality of gain factors is different than the first plurality of gain factors. In some embodiments, the method further includes (f) by the second analog circuit, outputting M sums of the products of step (e). In some embodiments, the method further includes (g) detecting another one of the events, corresponding to a failure of another electronic device, based on the M sums of the products of step (f).

In some embodiments, the method further includes, responsive to the failure of another electronic device, (h) by the first analog circuit, for each of the N analog input signals except for the analog input signals corresponding to any failed electronic devices, outputting products of that analog input signal and another plurality of gain factors that is different than any previously used plurality of gain factors. The method further can include (i) by the second analog circuit, outputting M sums of the products of step (h). The method further can include (j) detecting another one of the events, corresponding to a failure of another electronic device, based on the M sums of the products of step (i). The method further can include (k) repeating steps (h)-(j) for up to a total of N events.

In some embodiments, the first one of the events corresponds to a first one of the electronic devices detecting a particle.

In some embodiments, the gain factors of the first plurality of gain factors independently are +1 or −1.

Under another aspect, a system is provided for detecting events that are sparse in time. The system can include a first analog circuit configured so as to receive N analog input signals that are continuous and are independent from one another, wherein each one of the events causes a change in a corresponding one of the analog input signals, N is 2 or greater, and wherein the first analog circuit further is configured, for each of the N analog input signals, so as to output products of that analog input signal and a first plurality of gain factors. The system also can include a second analog circuit configured so as to output M sums of the products, wherein M is 2 or greater, and wherein M is less than or equal to N. The system also can include a processor configured so as to detect a first one of the events based on the M sums of the products.

In some embodiments, the N analog input signals include voltages, currents, frequencies, or phases from N corresponding electronic devices. In some embodiments, the first one of the events corresponds to a failure of a corresponding electronic device.

In some embodiments, the processor is further configured, responsive to the failure of the electronic device, to cause the first analog circuit, for each of the N analog input signals except for the analog input signal corresponding to the failed electronic device, to output products of those analog input signals and a second plurality of gain factors, wherein the second plurality of gain factors is different than the first plurality of gain factors. The second analog circuit can be configured to output M sums of those products. The processor further can be configured so as to detect another one of the events, corresponding to a failure of another electronic device, based on the M sums of those products.

In some embodiments, the processor is further configured, responsive to the failure of another electronic device, to cause the first analog circuit, for each of the N analog input signals except for the analog input signals corresponding to any failed electronic devices, to output products of those analog input signals and another plurality of gain factors that is different from any previously used plurality of gain factors. The second analog circuit can be configured to output M sums of those products. The processor further can be configured so as to detect another one of the events, corresponding to a failure of another electronic device, based on the M sums of those products. The system further can be configured to cause the processor, the first analog circuit, and the second analog circuit to repeat such steps for up to a total of N events.

In some embodiments, the first one of the events corresponds to a first one of the electronic devices detecting a particle.

In some embodiments, the gain factors of the first plurality of gain factors independently are +1 or −1.

DETAILED DESCRIPTION

Figure 1:
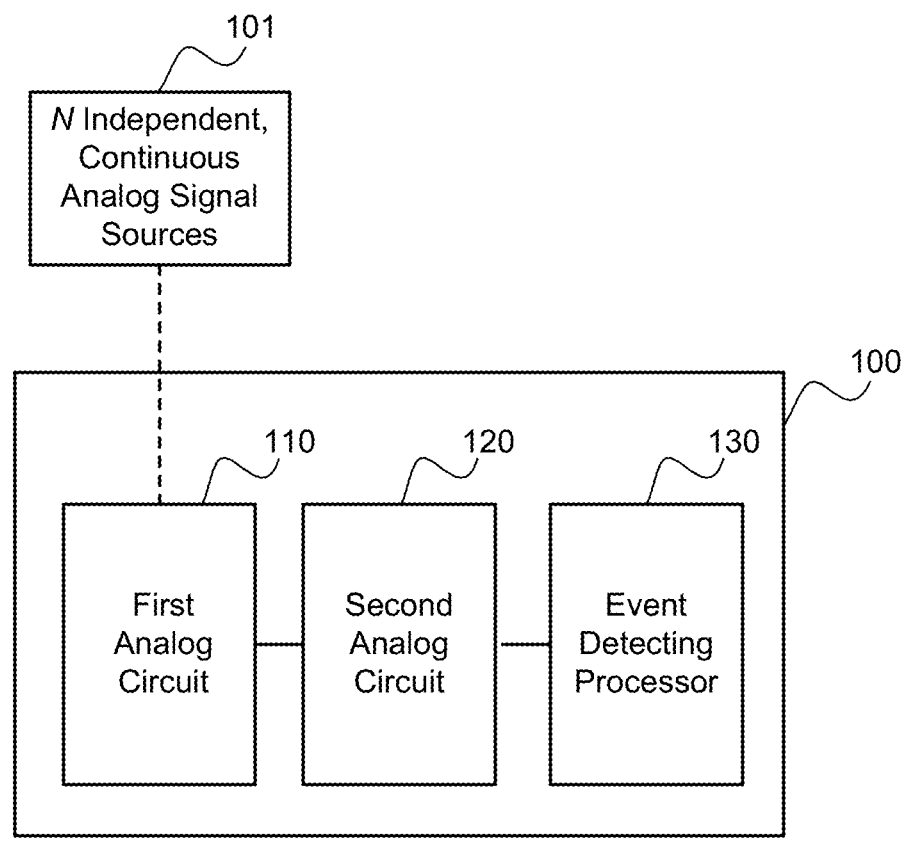
FIG. 1 schematically illustrates a system for detecting events that are sparse in time, according to some embodiments of the present invention.

Embodiments of the present invention provide systems and methods for detecting events that are sparse in time. For example, in some embodiments, the present systems and methods multiplex sparse analog signals with low signal loss, while continuously monitoring each of the signals. The signals can be considered to be sparse if, in some basis, they can be represented by a relatively small amount of unknown information. For example, a fixed non-sparse vector can be considered to be sparse if one component of that vector changes sparsely in time. The present systems and methods can detect events that are sparse in time, such as sparse changes in time of values of a vector, using analog circuitry configured to multiplex elements of that vector with one another using gain factors, which operations can be considered to correspond to applying a mixing matrix to that vector. Events can be detected based on the multiplexed vector elements using compressive sensing techniques.

As used herein, "event" is intended to mean something that happens that causes a measurable change in a signal. For example, an event can include failure of an electronic device, which causes a measurable change in a voltage, current, frequency, or phase from that device. Examples of electronic devices that can fail include, but are not limited to, resistors, capacitors, transistors, diodes, and the like, as well as more complex devices that include one or more of such electronic devices. Or, for example, an event can include an electronic device detecting a particle, which causes a measurable change in a voltage, current, frequency, or phase from that device. Examples of electronic devices that can detect particles include photodiodes, avalanche photodiodes, and photomultiplier tubes. Or, for example, an event can include an electronic device detecting a change in a thermodynamic value, such as temperature, pressure, volume, strain, or enthalpy change. In some embodiments, the signal that changes responsive to the event is a continuous analog signal.

As used herein, to "detect" an event is intended to mean identifying the source of a changed signal and how that signal changed. For example, detecting an event based upon a change occurring in a particular analog signal of N analog input signals can include identifying that particular analog signal at which the change occurred. Illustratively, in embodiments where events correspond to electronic device failures, a failure of a particular device can cause a change in a voltage, current, frequency, or phase from that device, and detecting the event (the device failure) can include identify the particular device that failed based on the change. As another example, in embodiments where events correspond to electronic devices detecting a particle, detection of a particle by a particular device can cause a change in a voltage, current, frequency, or phase from that device, and detecting the event (the particle detection) can include identify the particular device that detected the particle.

FIG. 1 schematically illustrates a system for detecting events that are sparse in time, according to some embodiments of the present invention. System 100 includes first analog circuit 110, second analog circuit 120 coupled so as to receive output from first analog circuit 110, and event detecting processor 130 coupled so as to receive output from second analog circuit 120. First analog circuit 110, second analog circuit 120, and event detecting processor 130 can be in electrical communication with one another via suitable communication channels, such as wired or wireless communication channels, or combination of wired and wireless communication channels. In some embodiments, system 100 includes a housing configured to hold some or all of first analog circuit 110, second analog circuit 120, and event detecting processor 130. In one non-limiting example, first analog circuit 110 and second analog circuit 120 are disposed on the same circuit board as one another.

First analog circuit 110 can be configured so as to receive N analog input signals that are continuous and are independent from one another. For example, first analog circuit 110 can be coupled to N independent, continuous analog signal sources, collectively designated 101 in FIG. 1. In some embodiments, first analog circuit 110 can include N input ports, each coupled to a corresponding one of the analog signal sources 110 via a suitable communication channel, such as a wired or wireless communication channel, or combination of wired and wireless communication channels. An event can cause a change in a corresponding one of the analog input signals. For example, in embodiments in which analog signal sources 101 include electronic devices, respective currents, voltages, frequencies, or phases from those electronic devices can change responsive to an event. In one nonlimiting example, the N analog input signals include voltages, currents, frequencies, or phases from N corresponding electronic devices. Illustratively, a first one of the events can correspond to a failure of a corresponding electronic device, or can correspond to a first one of the electronic devices detecting a particle.

Events can be expected to be sparse in time. For example, in some embodiments, it is expected that, at most, only a single event may occur at a given time. As such, it is expected that of the N signals received by first analog circuit 110, only a single one of those signals may change at a given time, responsive to an event at a corresponding single one of the analog signal sources 101, e.g., at a corresponding single one of the electronic devices. Expressed another way, it can be sufficiently statistically unlikely that more than one event occurs at a given time that the events can be considered to be sparse in time for the particular values of N and M being used, e.g., as expressed by equation (2) above.

Referring still to FIG. 1, first analog circuit 110 further can be configured, for each of the N analog input signals received from analog signal sources 101, so as to output products of that analog input signal and a plurality of gain factors. For example, in some embodiments, first analog circuit 110 can include N analog replicator circuit components, each of which receives a corresponding one of the N analog input signals and is configured so as to generate M replicas of that analog input signal. In some embodiments, N is 2 or greater, M is 2 or greater, and M is less than or equal to N. In some embodiments, first analog circuit 110 further can include M×N analog gain circuit components coupled to the replicator circuit components, each of which analog gain circuit components can be configured to multiply one of the replicas by a corresponding gain factor of the plurality of gain factors. Accordingly, first analog circuit 110 can be considered to apply an M×N mixing matrix to the N analog input signals, where the values of the elements of that matrix respectively correspond to gain factors of the plurality of gain factors, by which the M replicas of each of the N input signals respectively are multiplied. Note that in embodiments in which first analog circuit 110 includes M×N analog gain circuit components, such components can be provided using fewer than M×N commercially available analog devices.

Any suitable combination of circuit components can be used in first analog circuit 110. For example, first analog circuit 110 can include one or more operational amplifiers and one or more switches. Certain commercially available operational amplifiers (op-amps) can be configured so as to receive a plurality of signals and to output a plurality of replicas of each of those signals, so fewer op-amps can be used than the number of signals. As another example, certain commercially available switches can be configured so as to receive a plurality of signals and to apply different gain factors to each of those signals, so fewer switches can be used than the number of signals times the number of replicas. Exemplary configurations of first analog circuit 110 are described in greater detail herein with reference to FIGS. 3A-3C, 5, 6, and 7A-7G.

System 100 illustrated in FIG. 1 includes second analog circuit 120 configured so as to output M sums of the products output by first analog circuit 110. For example, in some embodiments, second analog circuit 120 can include M analog arithmetic circuits, each of which is configured so as to receive one of the M replicas of each one of the N analog input signals, multiplied by a corresponding gain factor, and further is configured so as to add together the received signals. As such, each one of the resulting M sums can include a contribution from a replica of each one of the N analog input signals, multiplied by a corresponding gain factor. Accordingly, second analog circuit 120 can be considered to generate a measurement vector of length M based on the M products of the N analog input signals (M×N mixing matrix).

Any suitable combination of circuit components can be used in second analog circuit 120. For example, second analog circuit 120 can include one or more op-amps. Certain commercially available op-amps can be configured so as to receive multiple pluralities of signals and to output sums of each of those pluralities of signals, so fewer op-amps can be used than the number of pluralities of signals. Exemplary configurations of second analog circuit 120 are described in greater detail herein with reference to FIGS. 3A-3C, 5, 6, and 7A-7G.

Referring still to FIG. 1, system 100 includes event detecting processor 130 configured so as to detect a first one of the events based on the M sums of the products, e.g., based on the output of second analog circuit 120. Event detecting processor 130 can include M input ports each configured to receive a corresponding one of the M sums of the products. Event detecting processor 130 can include any suitable device capable of detecting an event based on the M sums of the products, e.g., a processor, and can include a memory device such as random access memory (RAM), a flash drive, or other recordable medium for storing the M sums of the products (M elements of the measurement vector) as a continuous function of time, as well as an identification of an input signal carrying information about an event or a source of that input signal, e.g., the identity of the one of the N independent, continuous analog signal sources 101 at which the event occurred.

Event detecting processor 130 can be configured to identify at which of the N analog input signals a change occurred (and thus, at which of the N analog input signals an event occurred) based on the M sums of the products and on the plurality of gain factors (mixing matrix). For example, if the mixing matrix is square (if M=N), then event detecting processor 130 can identify at which of the N analog input signals a change occurred based on performing an operation that can be considered to be equivalent to multiplying the measurement matrix by the inverse of the mixing matrix. For example, a singular dot product of dimension M×1 (e.g., the measurement vector) can be multiplied by the Gauss-Markov theorem least-squares' solution, $(A^T A)^{-1} A^T$ (T for transpose operation), or by the inverse of a mixing matrix of dimension $[M \times M]^{-1}$, resulting in the received signal, having dimension M×1. Alternatively, if the mixing matrix is non-square (if M≠N), then event detecting processor 130 instead can identify the analog signal source at which the change (event) occurred through techniques known in the art of compressive sensing, e.g., using suitable computer software, which can be stored in a volatile or non-volatile memory device within event detecting processor 130, e.g., RAM, ROM, or flash memory.

As will be familiar to those of ordinary skill in the art, compressive sensing is a methodology for preprocessing sparse data in such a way that fewer resources can be used to obtain an accurate representation of the sparse data. See, for example, Candès et al., "An Introduction To Compressive Sampling," IEEE Signal Processing Magazine 25(2): 21-30 (March 2008), the entire contents of which are incorporated by reference herein. In some embodiments, the compressive sensing techniques employed in the systems and methods provided herein can use a set of algorithms developed for sampling signals and images at rates much lower than the traditional Nyquist rate. See, for example, Loris, "L1Packv2: A Mathematica package for minimizing an $l_1$-penalized functional," pg. 1-17 (Aug. 20, 2008), the entire contents of which are incorporated by reference herein. Loris discloses the use in compressive sensing of a Mathematica® (Wolfram Research, Champaign, Ill.) package called L1Packv2 that includes an algorithm called FindMinimizer that can be used to obtain a digital representation of the received signal. Event detecting processor 130 can use the L1Packv2 package, or any other suitable set of algorithms, to identify an analog signal source at which an event occurred, based on the mixing matrix and the measurement vector. Event detecting processor 130 further can be coupled to a display unit (not illustrated) such as an LED or LCD-based display screen configured to display the identified signal or source of that signal to a user.

Figure 2:
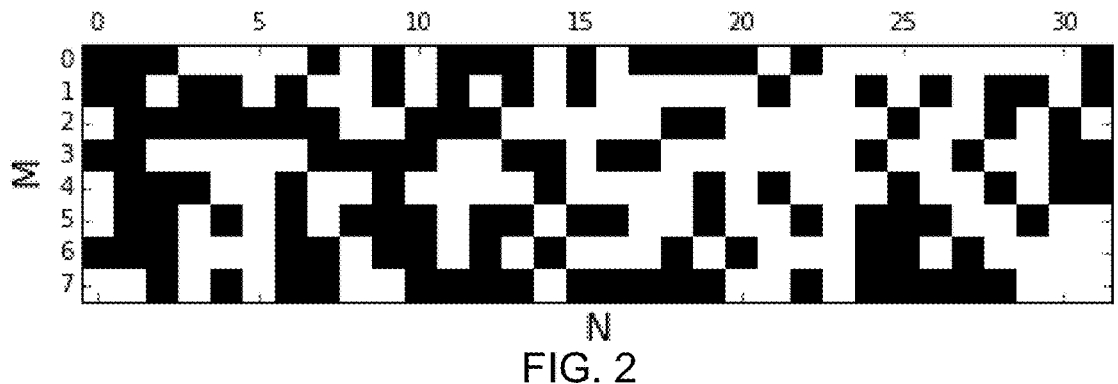
FIG. 2 schematically illustrates an exemplary mixing matrix that can be applied using a system such as illustrated in FIG. 1, according to some embodiments of the present invention.

Note that the gain factors respectively applied to the M×N analog signal replicas suitably can be selected such that event detecting processor 130 suitably can detect any events based on the M sums of the products output by second analog circuit 120. For example, in some embodiments, the gain factors of the plurality of gain factors independently are +1 or −1, Gaussian random numbers, or random numbers drawn from other suitable probability distributions as verified by simulation. For example, FIG. 2 schematically illustrates an exemplary mixing matrix that can be applied using a system such as illustrated in FIG. 1, according to some embodiments of the present invention. In FIG. 2, M=8, N=32, the black squares correspond to application of a gain factor of +1 to a corresponding one of the M replicas of one of the N analog input signals, and the white squares correspond to application of a gain factor of −1 to a corresponding one of the M replicas of one of the N analog input signals.

However, note that the gain factors of the plurality of gain factors may not necessarily be random or pseudorandom, as is typically the case with the elements of mixing matrices such as used in compressive sensing. For example, not all random or pseudorandom pluralities of gain factors may permit event detecting processor 130 suitably to detect events. In some embodiments, based on the particular values of M and N to be used with system 100 and the expected sparsity in time of the events, several different pluralities of gain factors can be generated; the ability of event detecting processor 130 to detect events based on each of such pluralities of gain factors can be simulated; and a plurality of gain factors can be selected for which event detecting processor 130 suitably can detect events.

Further details of some exemplary components that can be used with system 100 now will be described.

Figure 3A:
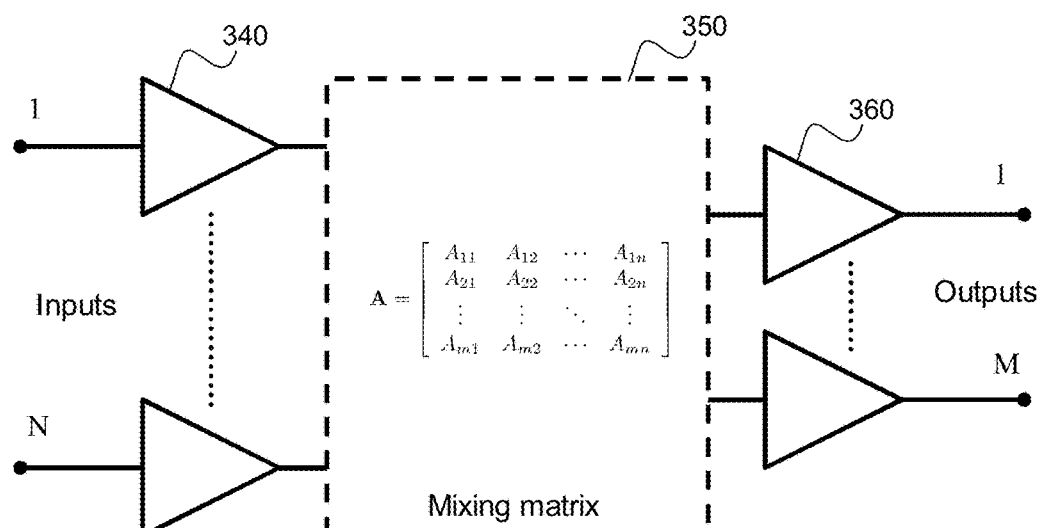
FIGS. 3A-3C schematically illustrate exemplary components of a system for detecting events that are sparse in time, according to some embodiments of the present invention.
Figure 3B:
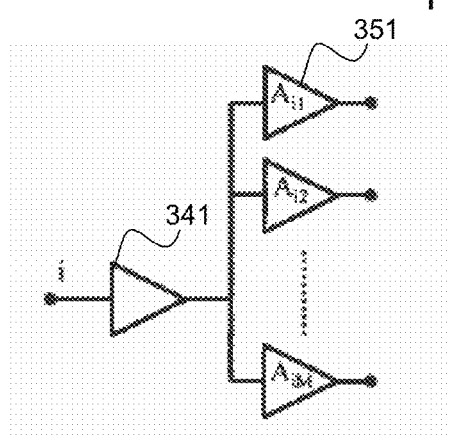
Figure 3C:
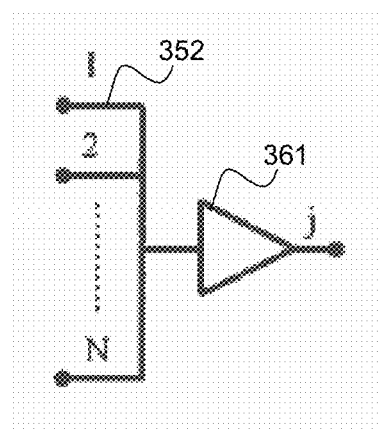

More specifically, FIGS. 3A-3C schematically illustrate exemplary components of a system for detecting events that are sparse in time, according to some embodiments of the present invention. FIG. 3A illustrates an exemplary arrangement that includes: input block 340 including 1 . . . N buffered inputs that are mixed linearly; circuitry 350 configured to apply mixing matrix A; and output block 360 including M buffered outputs, where M≤N and A is of dimension M×N. Circuitry 350 can include fixed circuitry configured to apply a static mixing matrix, or can include a control system configured to dynamically apply a changeable mixing matrix, e.g., reprogrammable circuitry under control of a suitably programmed processor, logical components such as implemented using a field programmable gate array (FPGA) or application specific integrated circuit (ASIC), or any other suitable component or combination of components.

FIG. 3B illustrates exemplary connections between the ith component 341 of input block 340, configured to receive the ith analog input signal and generate M replicas thereof, and components 351 of circuitry 350 that are configured to apply respective mixing matrix elements $A_{i1} \ldots A_{iM}$ (gain factors) to the M replicas of the ith analog input signal. The ith component 341 of input block 340 can include a buffer configured so as to buffer the ith analog input signal of the N analog input signals. Circuitry 350 can include M gain stages 351 coupled to the buffer so as each to receive a buffered replica of the ith analog input signal therefrom. Each gain stage 351 can be configured so as to output a product of the corresponding buffered replica of the ith analog input signal and a gain factor, that is, a corresponding one of the mixing matrix elements $A_{i1} \ldots A_{iM}$. It should be understood that an analogous input block 341 and components 351 can be provided corresponding to each of the 1 . . . N analog input signals. For example, input block 340 can include N buffers 341, each of which is coupled to M corresponding gain stages configured so as to output a product of the corresponding buffered replica of the respective analog input signal and a suitable gain factor (mixing matrix element). Gain stages 351 suitably can be implemented using switches, operational amplifiers, logical components such as implemented using a field programmable gate array (FPGA) or application specific integrated circuit (ASIC), or any other suitable component or combination of components.

FIG. 3C illustrates an exemplary connection between the jth component 361 of output block 360 and components 352 of circuitry 350 that are configured to route N of the products output by components 351 to the jth component 361. The jth component 361 can be configured so as to sum the N products that it receives, and so as to output that sum to a processor, e.g., an event detecting processor such as described above with reference to FIG. 1. It should be understood that an analogous output block 361 and components 352 can be provided corresponding to each other of the 1 . . . M output signals. For example, output block 360 can include M arithmetic circuits, each of which is coupled to N corresponding components 352 configured so as to route to that arithmetic circuit N products of buffered replicas of the analog input signal and a suitable gain factor. Components 352 can include switches, wiring, logical components such as implemented using a field programmable gate array (FPGA) or application specific integrated circuit (ASIC), or any other suitable component or combination of components.

Note that in the non-limiting embodiment illustrated in FIGS. 3A-3C, input block 340 and circuitry 350 can be considered to correspond to first analog circuit 110 described above with reference to FIG. 1, and output block 360 can be considered to correspond to second analog circuit 120 described above with reference to FIG. 1.

Still other exemplary embodiments of the present systems and components will be discussed further below with reference to FIGS. 5-7G.

An exemplary method for detecting events that are sparse in time now will be described.

Figure 4:
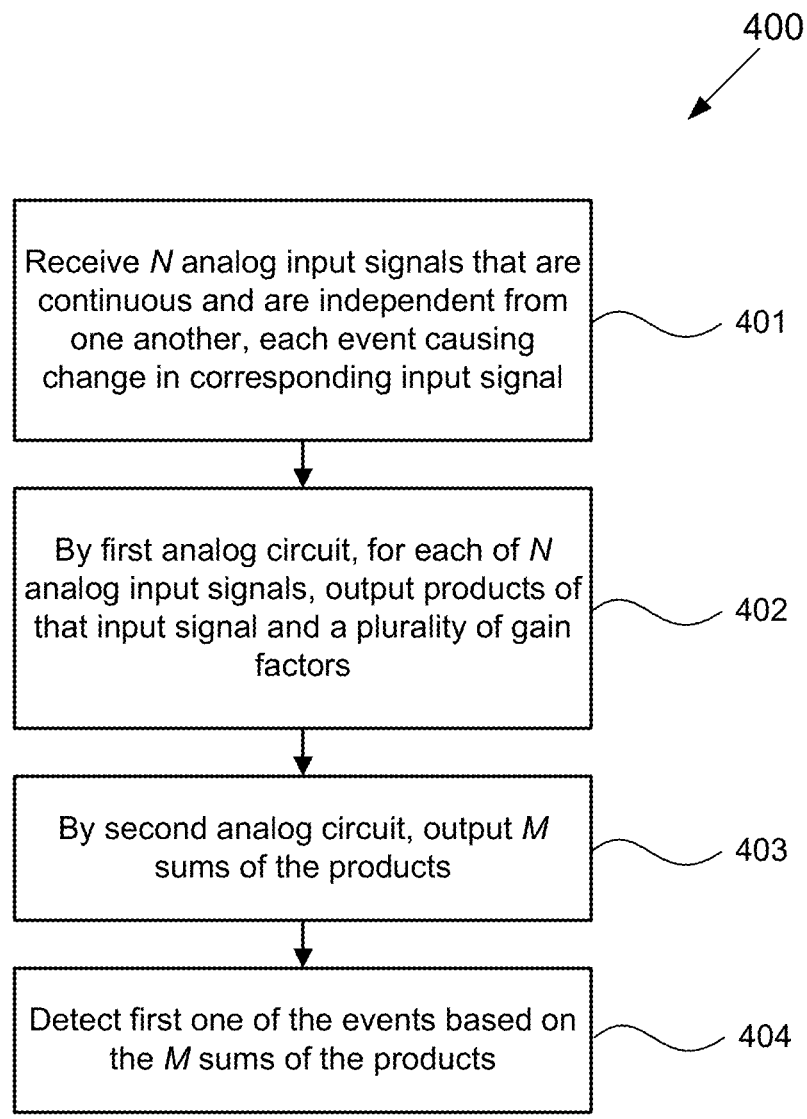
FIG. 4 schematically illustrates steps in a method for detecting events that are sparse in time, according to some embodiments of the present invention.

FIG. 4 schematically illustrates steps in a method for detecting events that are sparse in time, according to some embodiments of the present invention. Method 400 illustrated in FIG. 4 suitably can be used with any of the systems and components provided herein, e.g., systems and components such as described herein with reference to FIG. 1, 3A-3B, 5, 6, or 7A-7G, or with other suitable systems and components.

Method 400 illustrated in FIG. 4 includes receiving N analog input signals that are continuous and are independent from one another, wherein each event causes a change in a corresponding one of the analog input signals (401). For example, first analog circuit 110 described above with reference to FIG. 1 or input block 340 described above with reference to FIGS. 3A-3C can be coupled so as to receive N analog input signals from N independent, continuous analog signal sources. In some embodiments, the N analog input signals include voltages, currents, frequencies, or phases from N corresponding electronic devices. Illustratively, an event can correspond to a failure of a corresponding electronic device, or can correspond to a corresponding electronic device detecting a particle.

Method 400 illustrated in FIG. 4 also includes, by a first analog circuit, for each of the N analog input signals, outputting products of that analog input signal and a plurality of gain factors (402). For example, first analog circuit 110 described above with reference to FIG. 1 or buffer 341 and components 351 of circuitry 350 described above with reference to FIGS. 3A-3C can be configured so as to generate M replicas of each of the N analog input signals and to apply a suitable gain factor to each of such replicas. Similarly as noted above with reference to FIG. 1, in various embodiments of method 400, N can be 2 or greater, M can be 2 or greater, and M can be less than or equal to N. Illustratively, the gain factors of the plurality of gain factors independently can be +1 or −1, or any other suitable values.

Method 400 illustrated in FIG. 4 also includes, by a second analog circuit, outputting M sums of the products (403). For example, second analog circuit 120 described above with reference to FIG. 1 can be configured so as to receive the products outputted by first analog circuit 110 and to generate M sums, each sum being of N of the products. Or for example, each arithmetic circuit 361 described above with reference to FIGS. 3A-3C can be configured to as to receive N of the products via components 352 and to sum those components so as to generate an output.

Method 400 illustrated in FIG. 4 also includes detecting a first one of the events based on the M sums of the products (404). For example, a suitably programmed processor, such as event detecting processor 130, can receive the M sums of the products from second analog circuit 120 or from arithmetic circuit 361 and can detect an event based on the M sums, e.g., using compressive sensing techniques such as known in the art. For example, the processor can identify at which of the N analog input signals a change occurred, corresponding to an event.

Based on the foregoing, it should be understood that the present systems and methods suitably can reduce the number of channels that can be used to monitor N analog input signals that are sparse in time. For example, Table 1 below lists the number of channels (M) that suitably can be used so as to monitor N analog input signals for events that may correspond to changes in those signals, as well as the factor by which the number of channels (M) is reduced as compared to N, for events that are expected to occur at most one at a time, as calculated using equation (2) and by simulation to determine the constant of proportionality in equation (2).

TABLE 1

| N | M > | Factor |
|---|---|---|
| 32 | 8 | 4. |
| 64 | 10 | 6.4 |
| 128 | 12 | 10.67 |

TABLE 1-continued

| N | M > | Factor |
|---|---|---|
| 256 | 13 | 19.70 |
| 1024 | 16 | 64. |

Additionally, it should be appreciated that the number of analog input signals that are monitored, e.g., using system 100 or method 400, can be dynamically adjusted during use, such as based upon one or more events occurring. For example, in embodiments in which the N analog input signals include voltages, currents, frequencies, or phases from N corresponding electronic devices, and an event corresponds to a failure of a corresponding electronic device, it can be desirable to stop monitoring the analog input signal corresponding to that device. For example, the current, voltage, frequency, or phase from that failed device may be unstable, resulting in repeated changes in the corresponding analog input signal. Such changes may be non-sparse in time, and thus potentially can interfere with identifying signal changes that are sparse in time, e.g., corresponding to new failures of other electronic devices. Additionally, or alternatively, because the failed device has already been identified, additional information from that device may not be useful. Accordingly, referring again to FIG. 1, the processor (e.g., event detecting processor 130, or a separately provided processor), optionally can be configured, responsive to the failure of an electronic device, to cause the first analog circuit 110 to stop processing the analog input signal corresponding to the failed electronic device. For example, the processor can cause first analog circuit 110, for each of the N analog input signals except for the analog input signal corresponding to the failed electronic device, to output products of those analog input signals and a second plurality of gain factors.

In some embodiments, the second plurality of gain factors used to process the N−1 input signals is different than the plurality of gain factors used to process the original N analog input signals. For example, as noted further above, not all random or pseudorandom pluralities of gain factors may permit event detecting processor 130 suitably to detect events. Accordingly, the plurality of gain factors for which event detecting processor 130 suitably can detect events can be selected based on the particular values of M and N to be used with system 100—here, using the new value of N−1 instead of N—and the expected sparsity in time of the events. Second analog circuit 120 can be configured to output M sums of those products in a manner similar to that described above with reference to FIG. 1, and processor 130 can be configured so as to detect another one of the events, corresponding to a failure of another electronic device, based on the M sums of those products.

It should be appreciated that over sufficiently long measurement periods, up to N events can occur, e.g., up to N of the electronic devices can fail. Accordingly, processor 130 (or other suitable processor) further can be configured, responsive to the failure of another electronic device, to cause first analog circuit 110, for each of the N analog input signals except for the analog input signals corresponding to any failed electronic devices, to output products of those analog input signals and another plurality of gain factors that is different from any previously used plurality of gain factors. Second analog circuit 120 can be configured to output M sums of those products, and processor 130 further can be configured so as to detect another one of the events, corresponding to a failure of another electronic device, based on the M sums of those products. System 100 further can be configured to cause the processor, the first analog circuit, and the second analog circuit to repeat such steps for up to a total of N events, e.g., for the failure of up to all N of the electronic devices, within the system's constraints on the sizes of M and N. The various pluralities of gain factors, each corresponding to a different matrix size (e.g., N×M, (N−1)×M, (N−2)×M, . . . (N−i)×M), suitably can be stored in a computer readable medium that is accessible by the processor. The gain factors of the various respective pluralities of gain factors can be applied to the M replicas of each of the N, N−1, N−2, . . . N−i analog input signals using suitable circuitry, e.g., by controlling the gain factor applied using first analog circuit 110 described above with reference to FIG. 1 or gain stages 351 described above with reference to FIGS. 3A-3C.

Some non-limiting examples of various optional embodiments, configurations, and components of the present systems now will be described. It should be appreciated that such examples are intended to be purely illustrative, and not limiting of the present invention.

Figure 5:
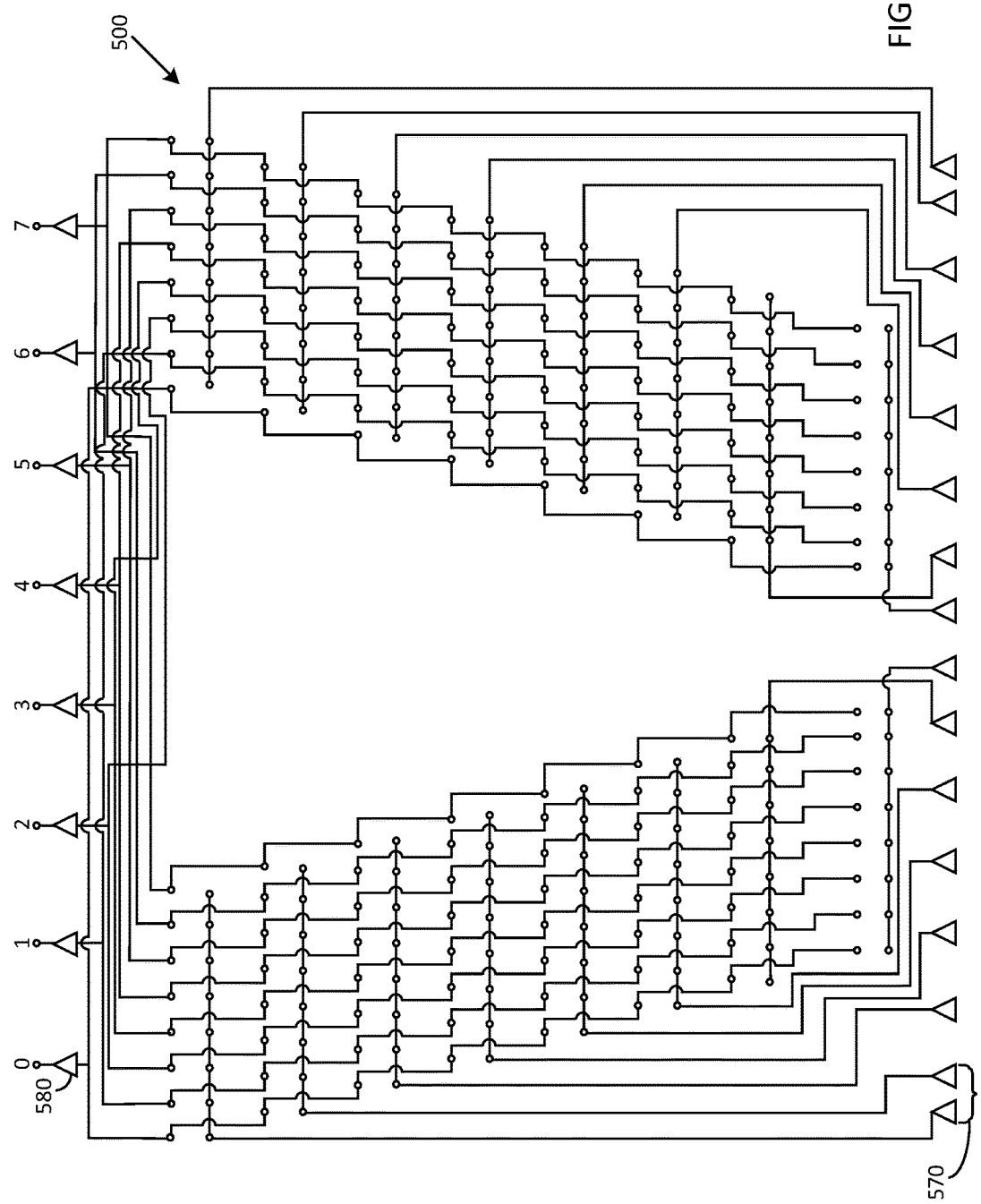
FIG. 5 schematically illustrates a non-limiting example of a system for detecting events that are sparse in time, according to some embodiments of the present invention.

FIG. 5 schematically illustrates a non-limiting example of a system for detecting events that are sparse in time, according to some embodiments of the present invention. System 500 illustrated in FIG. 5 includes N=8 buffers 570, each receiving a corresponding analog input signal, and each providing a non-inverted output and an inverted output (labeled "i"). The non-inverted and inverted outputs of each buffer 570 are routed via suitable conductive pathways to respective logical components labeled 0, 0i, 1, 1i, . . . 7i at which suitable gain factors respectively are applied to such non-inverted and inverted outputs, e.g., using switches, operational amplifiers, or other suitable circuitry, including but not limited to programmable logic of an FPGA or ASIC. Combinations of the resulting products then are routed via suitable conductive pathways to M=8 outputs 580 that respectively sum the products, and provide an output to an event detecting processor (not specifically illustrated) that can be configured similarly as described elsewhere herein. In one non-limiting example, buffers 570 and the logical components can be considered to correspond to first analog circuit 110 described above with reference to FIG. 1, and outputs 580 can be considered to correspond to second analog circuit 120 described above with reference to FIG. 1.

Figure 6:
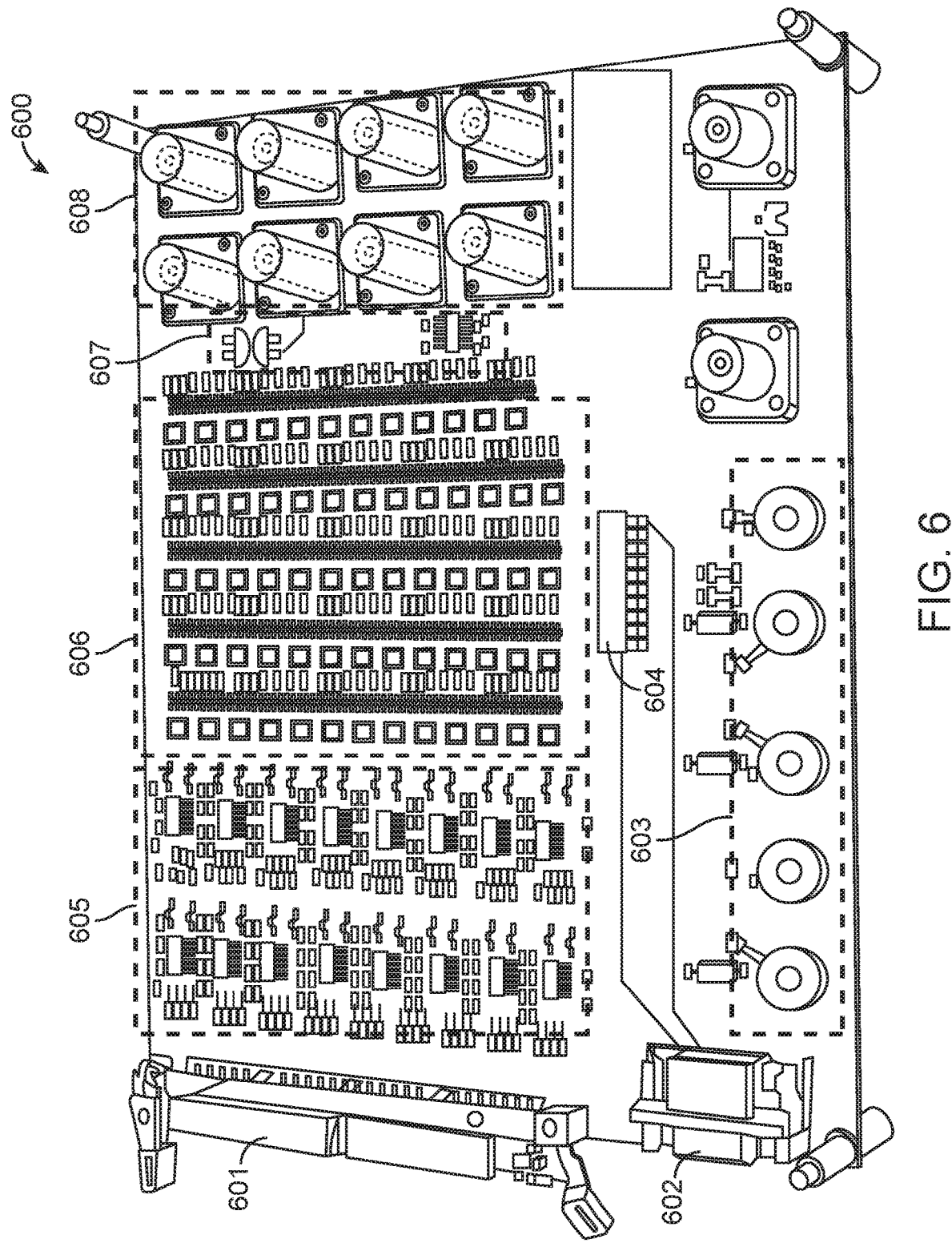
FIG. 6 is a photographic image depicting another non-limiting example of a system for detecting events that are sparse in time, according to some embodiments of the present invention.

FIG. 6 is a photographic image depicting another non-limiting example of a system for detecting events that are sparse in time, and FIGS. 7A-7G schematically illustrate exemplary components of the system of FIG. 6, according to some embodiments of the present invention. System 600 illustrated in FIG. 6 includes input connector 601 such as described in greater detail below with reference to FIG. 7A; RS232 connector 602 such as described in greater detail below with reference to FIG. 7B; input power plugs 603 such as described in greater detail below with reference to FIG. 7C; microcontroller 604 such as described in greater detail below with reference to FIG. 7D; operational amplifiers 605 such as described in greater detail below with reference to FIG. 7E; switches 606 such as described in greater detail below with reference to FIG. 7F; and operational amplifiers 607 and outputs 608 such as described in greater detail below with reference to FIG. 7G. In one non-limiting example, operational amplifiers 605 and switches 606 can be considered to correspond to first analog circuit 110 described above with reference to FIG. 1, and operational amplifiers 607 and outputs 608 can be considered to correspond to second analog circuit 120 described above with reference to FIG. 1.

Figures 7A, 7B, 7C:
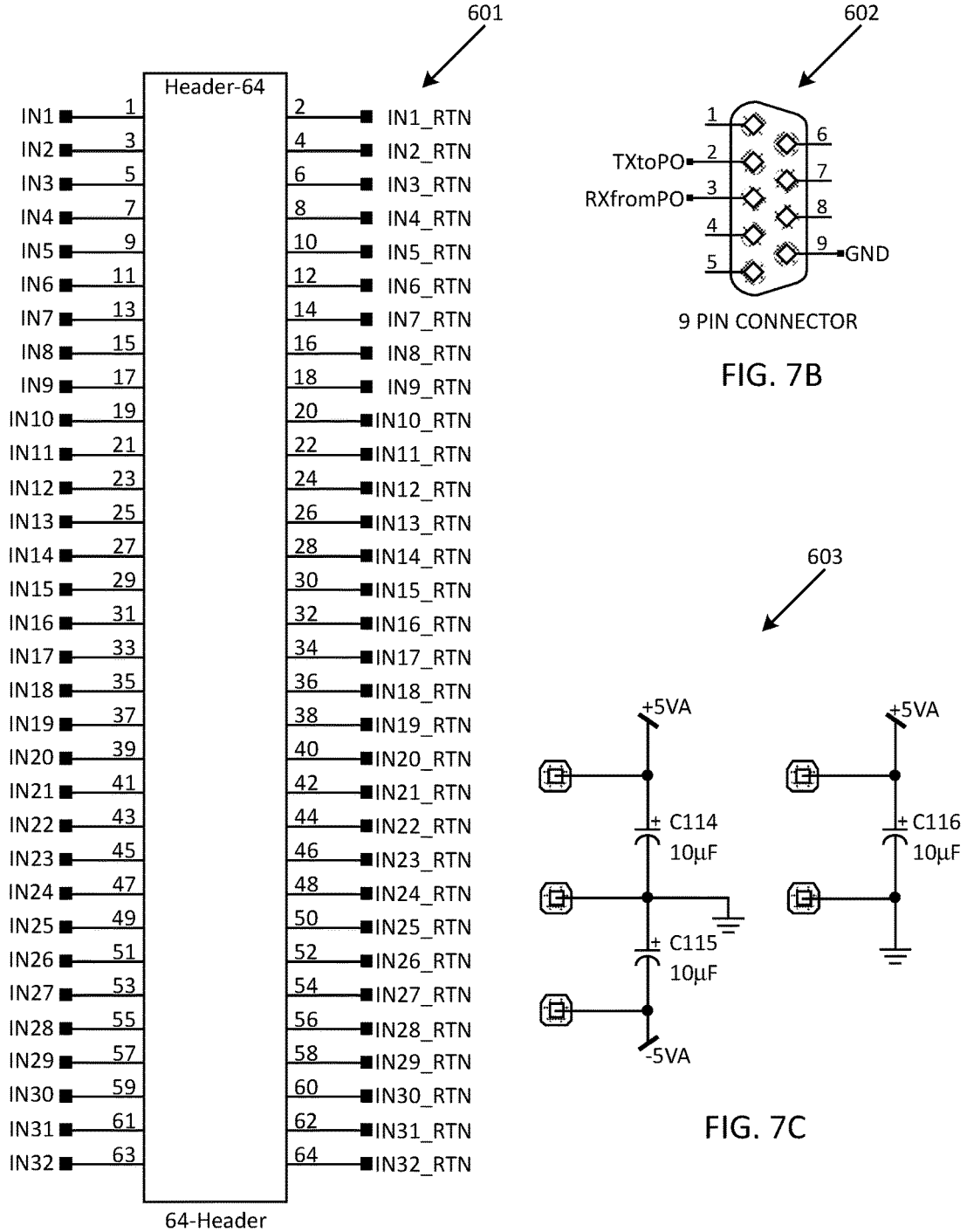
FIGS. 7A-7G schematically illustrate exemplary components of the system of FIG. 6, according to some embodiments of the present invention.

In this exemplary embodiment, input connector 601 illustrated in FIG. 7A is configured to receive a 64-pin ribbon cable via which N=32 analog input signals and their returns are input into system 600.

RS232 connector 602 illustrated in FIG. 7B is configured to receive a standard serial interface to a personal computer using the RS-232 protocol for software control of the analog switch positions.

Input power plugs 603 illustrated in FIG. 7C is configured to receive power for the analog circuits (+5V, −5V and a single return for these voltages) and for the digital circuits (+5V and a single return for this voltage).

Figure 7D:
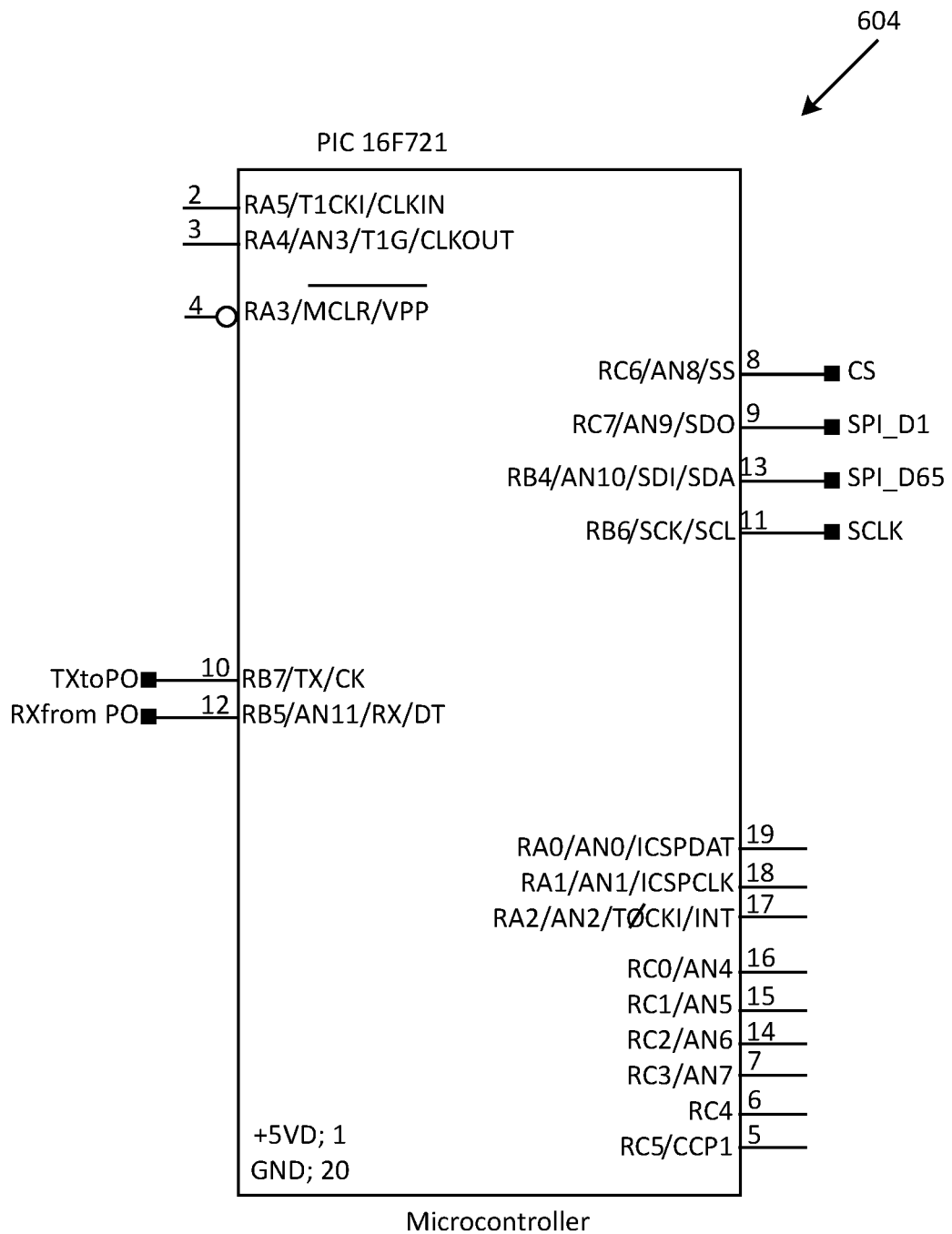

Microcontroller 604 illustrated in FIG. 7D is used as the interface device from the PC to the analog switches and is programmed to accept commands to set the switch positions and to return current status of the switch positions.

Figure 7E:
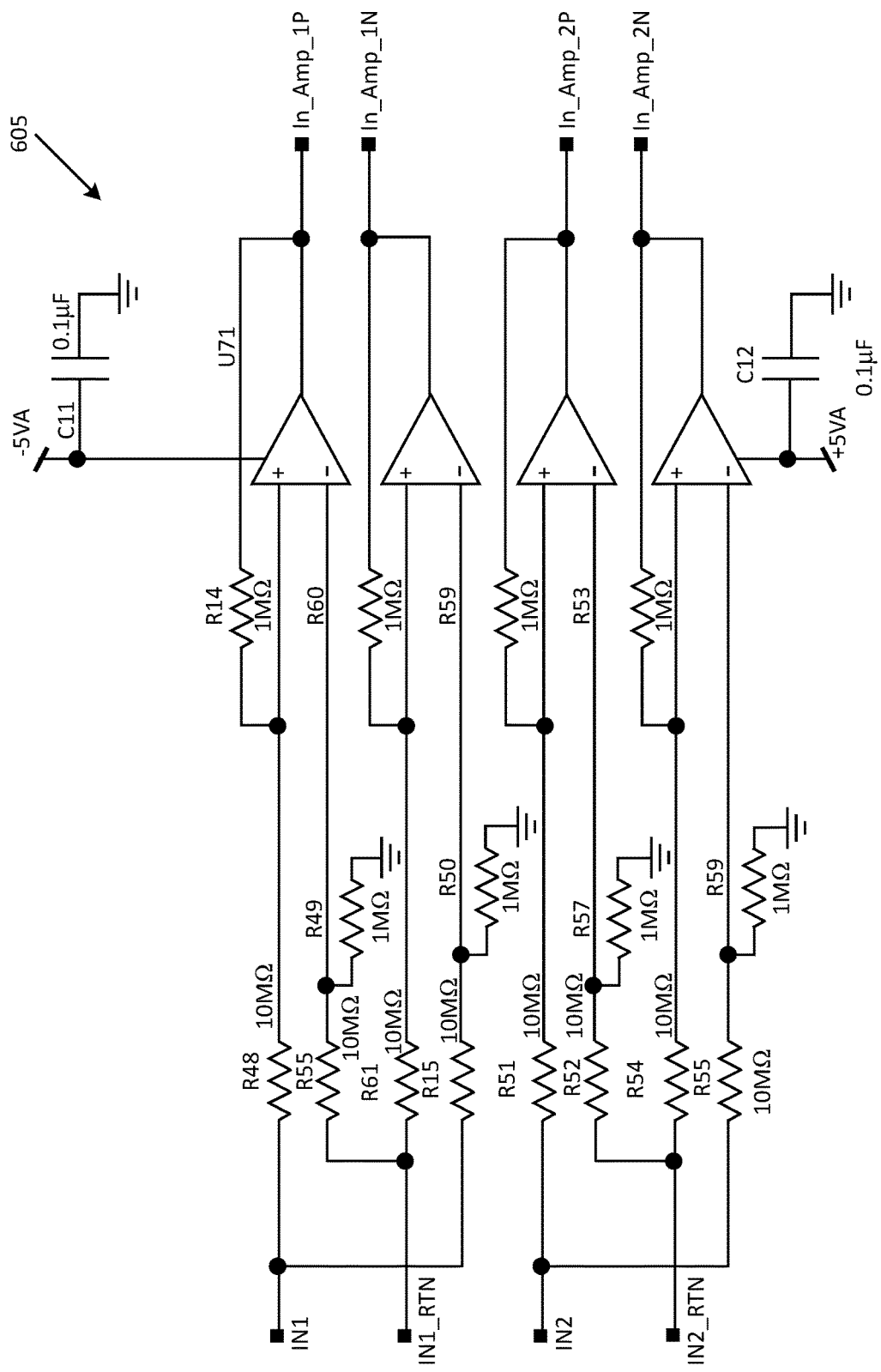

Each operational amplifier (op-amp) 605 such as illustrated in FIG. 7E is configured to receive respective analog input signals and, for each signal, to generate M non-inverted replicas of that signal and M inverted replicas of that signal. As noted above, certain commercially available operational amplifiers (op-amps) can be configured so as to receive a plurality of signals and to output a plurality of replicas of each of those signals, so fewer op-amps can be used than the number of signals. In the embodiment illustrated in FIGS. 6 and 7A-7G, N/2 (16) op-amps 605 are provided so as to generate replicas of N (32) analog input signals. The op-amps are rail-to-rail precision amplifiers with a wide supply voltage range.

Figure 7F:
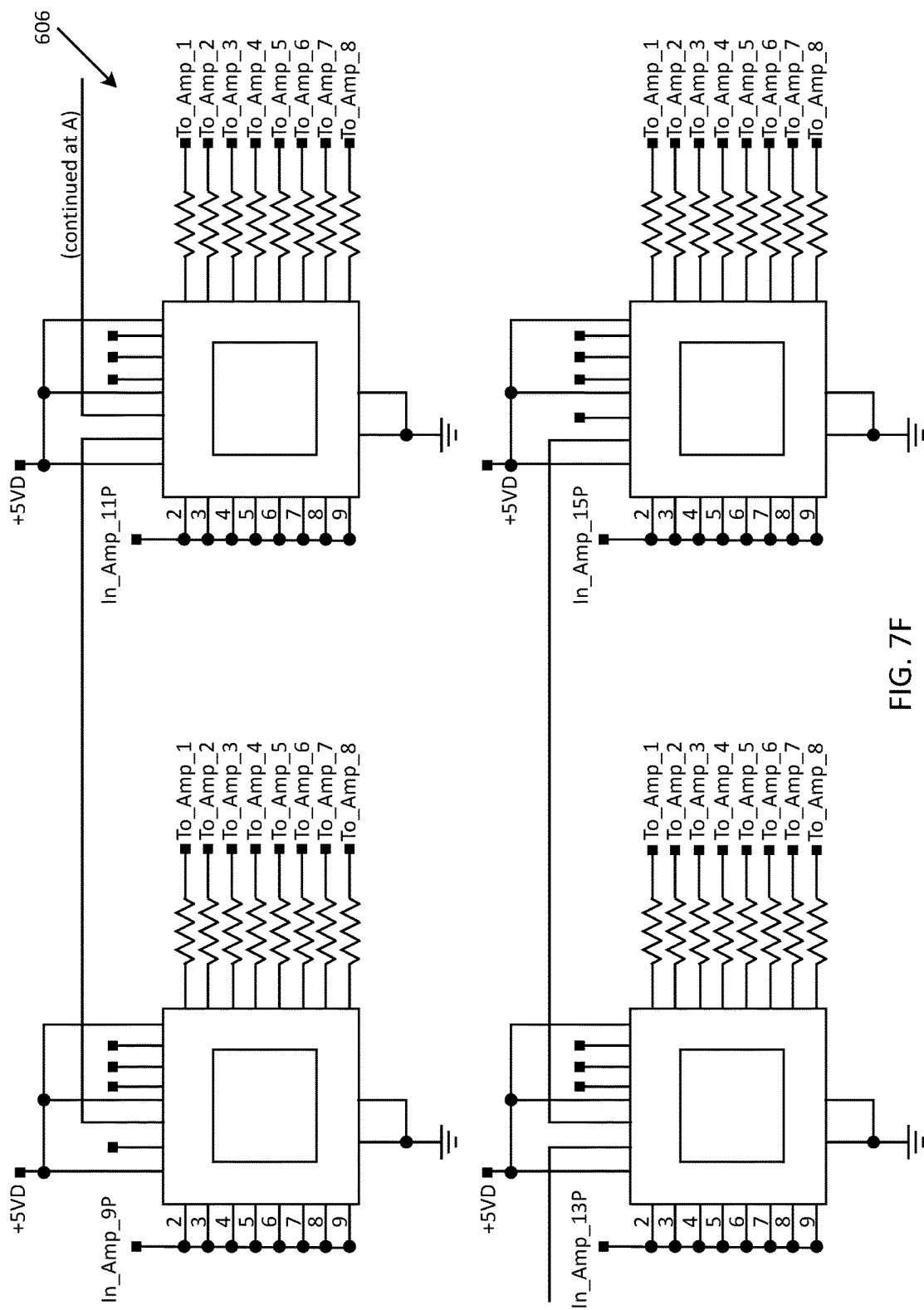

Each switch 606 such as illustrated in FIG. 7F is configured to receive non-inverted and inverted replicas of analog input signals and to apply appropriate gain factors thereto. As noted above, certain commercially available switches can be configured so as to receive a plurality of signals and to apply different gain factors to each of those signals, so fewer switches can be used than the number of signals times the number of replicas. In the embodiment illustrated in FIGS. 6 and 7A-7G, (M×N)/4 (64) octal switches 606 are provided so as to apply respective gain factors to each of the M (8) replicas of the N (32) analog input signals and their inverses (×2) (total of 512 inverted and non-inverted replicas). The switches are octal switches with low on-resistance (less than 0.5 mohm) and beyond-the-rails signal range (+/−5.5V). The switch positions are controlled by a standard SPI interface (Serial Peripheral Interface bus) for easy control and daisy-chaining of devices.

Figure 7G:
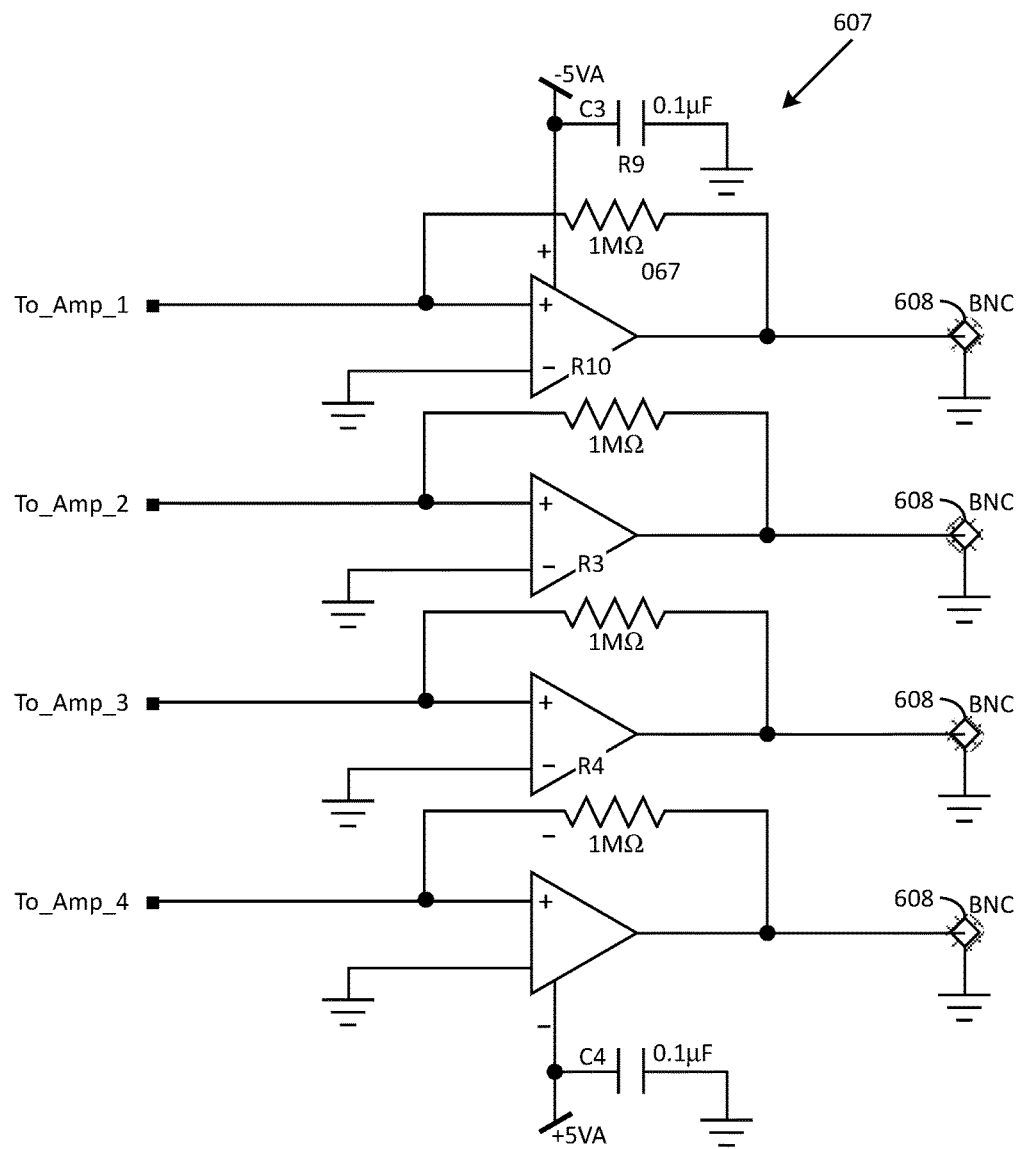

Each operational amplifier (op-amp) 607 such as illustrated in FIG. 7G is configured to receive from switches 606 the products of the analog input signals and respective gain factors, and to output at 608 a sum of the products received by that op-amp 607. As noted above, certain commercially available op-amps can be configured so as to receive multiple pluralities of signals and to output sums of each of those pluralities of signals, so fewer op-amps can be used than the number of pluralities of signals. In the embodiment illustrated in FIGS. 6 and 7A-7G, (M×N)/128 (2) quad op-amps are provided so as to sum the outputs of the products of the M×N×2 (512) inverted and non-inverted replicas with respective gain factors, and to provide respective sums at outputs 608. These op-amps are also rail-to-rail precision amplifiers with low input bias current (less than +/−1 pA) and low offset voltage (less than +/−200 uV).

In one non-limiting, purely illustrative example, a system 600 described with reference to FIGS. 6 and 7A-7G is used to perform accelerated life testing of electronic devices. The accelerated life testing of devices is an important part of qualifying such devices for use in outer space. For example, irradiation, heating, or overbiasing are typical failures used to stress devices and induce premature failures. Such failures (or lack thereof) can place bounds on the survival probability of devices under standard operation. A predetermined bound can be set, based on the application, for these devices to qualify for use in outer space. Because of the nearly prohibitive cost of operating anything in outer space, each device is shown to be reliable within specific tolerances. Accelerated life testing also can be expensive both in cost and time, because many devices are monitored for long periods of time and, in previously known methods, using a large number of readout channels. For example, for a 0-failure test to determine at least 90% reliability for the measured time interval at the 90% confidence level, N=22 electronic devices can be monitored. For 99% reliability at the 90 confidence level, 3×77 or N=231 units can be monitored. For 99.99% reliability, N=2302 units can be monitored. The present systems and methods can be used in an accelerated life testing program based on continuously monitoring a significantly reduced number of channels (M) as compared to the number of devices under test (N).

While various illustrative embodiments of the invention are described above, it will be apparent to one skilled in the art that various changes and modifications can be made therein without departing from the invention. For example, any suitable events that are sparse in time can be detected. The appended claims are intended to cover all such changes and modifications that fall within the true spirit and scope of the invention.

What is claimed:

1. A method for detecting events at one or more electronic devices, wherein the events are sparse in time, the method comprising:
   (a) at each electrical input node of N electrical input nodes of a first analog circuit comprising a first operational amplifier, receiving a respective analog electrical input signal of N analog electrical input signals, the first operational amplifier outputting a replica of the respective analog electrical input signal,
      wherein the analog electrical input signals are continuous and are independent from one another,
      wherein the N analog electrical input signals include voltages, currents, frequencies, or phases from N corresponding electronic devices,
      wherein each one of the events causes a change in a corresponding one of the analog electrical input signals, and
      wherein N is 2 or greater;
   (b) by the first analog circuit, for each of the N analog electrical input signals, outputting products of replicas of that analog electrical input signal multiplied by gain factors of a first plurality of gain factors;
   (c) by each electrical output node of M electrical output nodes of a second analog circuit comprising a second operational amplifier, outputting M analog electrical output signals comprising a respective sum of M sums of the products,
      wherein M is 2 or greater, and
      wherein M is less than or equal to N; and
   (d) detecting, by a processor, a first one of the events based on the M analog electrical output signals, wherein the first one of the events corresponds to a failure in one of the analog electrical input signals of a corresponding electronic device;
   responsive to the failure of the electronic device:
   (e) by the first analog circuit, for each analog electrical signal of the N analog electrical input signals except for the analog electrical input signal corresponding to the failed electronic device, outputting products of replicas of that analog electrical input signal multiplied by gain factors of a second plurality of gain factors,
   wherein the second plurality of gain factors is different than the first plurality of gain factors,
(f) by each electrical output node of the M electrical output nodes of the second analog circuit, outputting a respective sum of M sums of the products of step (e);
(g) detecting, by the processor, another one of the events, corresponding to a failure of another electronic device, based on the M sums of the products of step (f);
responsive to the failure of another electronic device;
(h) by the first analog circuit, for each analog electrical signal of the N analog electrical input signals except for the analog electrical input signals corresponding to any failed electronic devices, outputting products of replicas that analog electrical input signal multiplied by gain factors of another plurality of gain factors that is different than any previously used plurality of gain factors;
(i) by each electrical output node of the M electrical output nodes of the second analog circuit, outputting a respective sum of M sums of the products of step (h);
(j) detecting, by the processor, another one of the events, corresponding to a failure of another electronic device, based on the M sums of the products of step (i); and
(k) repeating steps (h)-(j) for up to a total of N events.

2. The method of claim 1, wherein the first one of the events corresponds to a first one of the electronic devices detecting a particle and the first one of the electronic devices is a photodiode, an avalanche photodiode, or a photomultiplier tube.

3. The method of claim 1, wherein the gain factors of the first plurality of gain factors independently are +1 or −1.

4. A system for detecting events at one or more electrical devices, wherein the events are sparse in time, the system comprising:
   a first analog circuit comprising N electrical input nodes and a first operational amplifier, wherein:
      each electrical input node is configured to receive a respective analog electrical input signal of N analog electrical input signals, the first operational amplifier outputting a replica of the respective analog electrical input signal,
      the analog electrical input signals are continuous and are independent from one another,
      the N analog electrical input signals include voltages, currents, frequencies, or phases from N corresponding electronic devices,
      each one of the events causes a change in a corresponding one of the analog electrical input signals,
      N is 2 or greater, and
      the first analog circuit is configured, for each of the N analog electrical input signals, so as to output products of replicas of that analog electrical input signal multiplied by a first plurality of gain factors;
   a second analog circuit comprising M electrical output nodes and a second operational amplifier, wherein:
      each electrical output node is configured so as to output M analog electrical output signals comprising a respective sum of M sums of the products,
      M is 2 or greater, and
      M is less than or equal to N; and
   a processor configured:
      to detect a first one of the events based on the M analog electrical output signals, wherein the first one of the events corresponds to a failure in one of the analog electrical input signals of a corresponding electronic device,
      responsive to the failure of the electronic device, to cause the first analog circuit, for each remaining analog electrical input signal of the N analog electrical input signals except for the analog electrical input signal corresponding to the failed electronic device, to output products of replicas of the remaining analog electrical input signals multiplied by gain factors of a second plurality of gain factors,
         wherein the second plurality of gain factors is different than the first plurality of gain factors;
      to detect another one of the events, corresponding to a failure of another electronic device, based on the M sums of the products of the replicas of the remaining analog electrical input signals multiplied by the gain factors of the second plurality of gain factors,
      responsive to the failure of another electronic device, to cause the first analog circuit, for each remaining of the N analog electrical input signals except for the analog electrical input signals corresponding to any failed electronic devices, to output products of replicas of the remaining analog electrical input signals multiplied by gain factors of another plurality of gain factors that is different from any previously used plurality of gain factors,
         wherein each electrical output node of the M electrical output nodes of the second analog circuit is configured to output a respective sum of M sums of the products of the replicas of the remaining analog electrical input signals multiplied by the gain factors of the second plurality of gain factors;
      to detect another one of the events, corresponding to a failure of another electronic device, based on the M sums of the products of the replicas of the remaining analog electrical input signals multiplied by the gain factors of the second plurality of gain factors, and
   wherein the system further is configured to cause the processor, the first analog circuit, and the second analog circuit to repeat such steps for up to a total of N events.

5. The system of claim 4, wherein the first one of the events corresponds to a first one of the electronic devices detecting a particle and the first one of the electronic devices is a photodiode, an avalanche photodiode, or a photomultiplier tube.

6. The system of claim 4, wherein the gain factors of the first plurality of gain factors independently are +1 or −1.

7. A method for detecting events at one or more electronic devices, wherein the events are sparse in time, the method comprising:
   (a) at each electrical input node of N electrical input nodes of a first analog circuit comprising a first operational amplifier, receiving a respective analog electrical input signal of N analog electrical input signals, the first operational amplifier outputting a replica of the respective analog electrical input signal,
      wherein the analog electrical input signals are continuous and are independent from one another,
      wherein the N analog electrical input signals include voltages, currents, frequencies, or phases from N corresponding electronic devices, wherein each one of the events causes a change in a corresponding one of the analog electrical input signals, and
wherein N is 2 or greater;
(b) by the first analog circuit, for each of the N analog electrical input signals, outputting products of replicas of that analog electrical input signal multiplied by gain factors of a first plurality of gain factors;
(c) by each electrical output node of M electrical output nodes of a second analog circuit comprising a second operational amplifier, outputting M analog electrical output signals comprising a respective sum of M sums of the products,
wherein M is 2 or greater, and
wherein M is less than or equal to N; and
(d) detecting, by a processor, a first one of the events based on the M analog electrical output signals, wherein the first one of the events corresponds to a change in one of the analog electrical input signals of a corresponding electronic device,
responsive to the change of the electronic device:
(e) by the first analog circuit, for each analog electrical signal of the N analog electrical input signals except for the analog electrical input signal corresponding to the failed electronic device, outputting products of replicas of that analog electrical input signal multiplied by gain factors of a second plurality of gain factors,
wherein the second plurality of gain factors is different than the first plurality of gain factors,
(f) by each electrical output node of the M electrical output nodes of the second analog circuit, outputting a respective sum of M sums of the products of step (e);
(g) detecting, by the processor, another one of the events, corresponding to a failure of another electronic device, based on the M sums of the products of step (f),
responsive to the failure of another electronic device:
(h) by the first analog circuit, for each analog electrical signal of the N analog electrical input signals except for the analog electrical input signals corresponding to any failed electronic devices, outputting products of replicas that analog electrical input signal multiplied by gain factors of another plurality of gain factors that is different than any previously used plurality of gain factors;
(i) by each electrical output node of the M electrical output nodes of the second analog circuit, outputting a respective sum of M sums of the products of step (h);
(j) detecting, by the processor, another one of the events, corresponding to a failure of another electronic device, based on the M sums of the products of step (i); and
(k) repeating steps (h)-(j) for up to a total of N events.

8. The method of claim 7, wherein the first one of the events corresponds to a first one of the electronic devices detecting a particle and the first one of the electronic devices is a photodiode, an avalanche photodiode, or a photomultiplier tube.

9. The method of claim 7, wherein the gain factors of the first plurality of gain factors independently are +1 or −1.

* * * * *